United States Patent
Chiang et al.

(10) Patent No.: US 6,200,860 B1
(45) Date of Patent: Mar. 13, 2001

(54) PROCESS FOR PREVENTING THE REVERSE TUNNELING DURING PROGRAMMING IN SPLIT GATE FLASH

(75) Inventors: An-Ming Chiang; Kuei-Wu Huang, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/304,305

(22) Filed: May 3, 1999

(51) Int. Cl.⁷ ............................................. H01L 21/8247
(52) U.S. Cl. ...................... 438/266; 438/666; 438/978
(58) Field of Search ........................... 438/257, 265, 438/266, 267, 592, 666, 978

(56) References Cited

U.S. PATENT DOCUMENTS

| | | | |
|---|---|---|---|
| 4,074,300 | * 2/1978 | Sakai et al. | 438/592 |
| 5,597,751 | 1/1997 | Wang | 437/43 |
| 5,652,161 | 7/1997 | Ahn | 437/43 |
| 5,716,865 | 2/1998 | Ahn | 437/43 |
| 5,766,988 | 6/1998 | Cho et al. | 438/159 |
| 5,920,781 | * 7/1999 | Imoto | 438/978 |
| 5,937,299 | * 2/1999 | Michael et al. | 438/592 |

* cited by examiner

*Primary Examiner*—Chandra Chaudhari
(74) *Attorney, Agent, or Firm*—George O. Saile; Stephen B. Ackerman

(57) ABSTRACT

A method is provided to form a split-gate flash memory not susceptible to inadvertent reverse tunneling during programming. This is accomplished by forming a silicon nitride spacer on the negatively tapered walls of the floating gate of the cell which serves as a barrier to reverse tunneling. The negatively tapered walls, in contrast to vertical walls, is disclosed to provide a geometry better suited for forming thicker spacers around the floating gate, which in turn serve to act as a more robust barrier to reverse tunneling. Furthermore, it is shown that the method requires fewer steps than practiced in prior art.

16 Claims, 5 Drawing Sheets

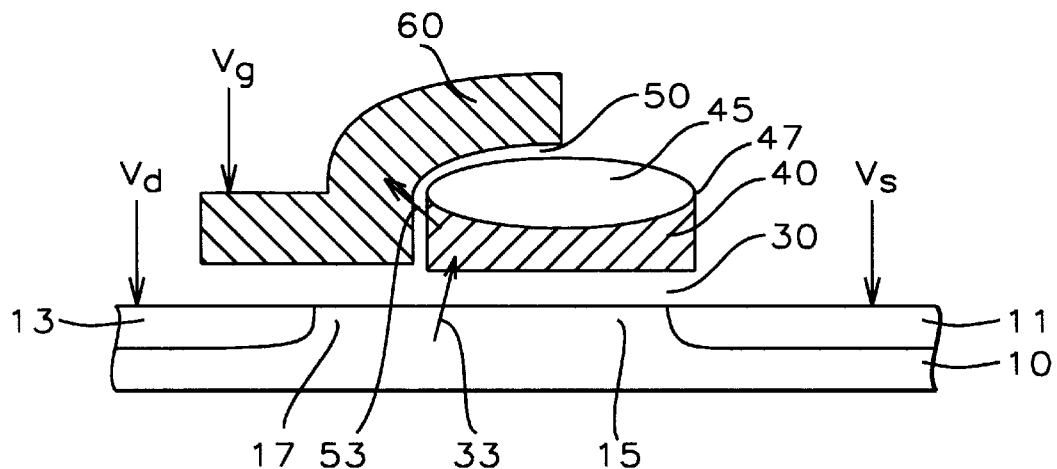
*FIG. 1 - Prior Art*
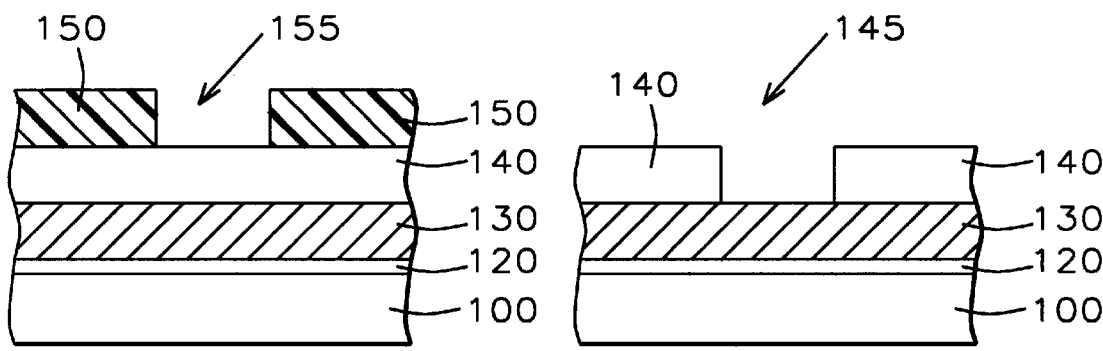
*FIG. 2a*     *FIG. 2b*
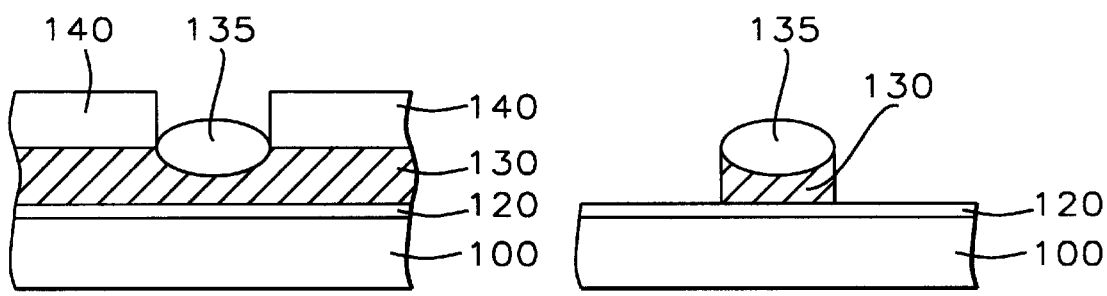
*FIG. 2c*     *FIG. 2d*

PROCESS FOR PREVENTING THE REVERSE TUNNELING DURING PROGRAMMING IN SPLIT GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of forming a split-gate flash cell not susceptible to inadvertent reverse tunneling during programming.

(2) Description of the Related Art

Programming (writing) and erasing of memory cells is accomplished by tunneling of electrons to and from the three components of a split-gate flash memory cell, namely, the substrate, floating gate and the control gate. The transfer of electrons is affected through the intervening thin oxide layers between the components by applying different levels of voltage on the control gate and the source and drain of the cell, as is known in the art. In order to prevent inadvertent reverse tunneling, prior art teaches various methods of forming barrier oxide barriers and spacers associated with the intervening layers. These methods, however, involve extra process steps which in turn introduce product reliability problems, and added difficulties in product manufacturability. It is disclosed later in the embodiments of the present invention a process for preventing reverse tunneling in a split-gate flash memory cell without the complexities of prior art.

Most conventional flash-EEPROM cells use a double-polysilicon (poly) structure of which the well known split-gate cell is shown in FIG. 1. There, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1, control gate (60) overlaps the channel region, (17), adjacent to channel (15) under the floating gate, (40). It will be known to those skilled in the art that this structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance.

To program the transistor shown in FIG. 1 which shows the placement of gate, source and drain voltages or $V_g$, $V_s$ and $V_d$, respectively, charge is transferred from substrate (10) through gate oxide (30) and is stored on floating gate (40) of the transistor. The amount of charge is set to one of two levels to indicate whether the cell has been programmed "on" or "off." "Reading" of the cell's state is accomplished by applying appropriate voltages to the cell source (11) and drain (13), and to control gate (60), and then sensing the amount of charge on floating gate (40). To erase the contents of the cell, the programming process is reversed, namely, charges are removed from the floating gate by transferring them back to the substrate through the gate oxide. Electron tunneling occurs through oxide regions (33) and (53) shown in FIG. 1.

This programming and erasing of an EEPROM is accomplished electrically and in-circuit by using Fowler-Nordheim (F-N) tunneling as is well known in prior art. During programming, a sufficiently high voltage is applied go to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. As the electronic charge builds up on the floating gate, the electric field is reduced, which reduces the electron flow. Of importance in the tunneling region is the quality and the thinness of the tunneling oxide separating the floating gate from the substrate. Inadvertent reverse tunneling, or erasure, for example, may occur if the tunnel oxide is degraded, or other barriers to reverse tunneling are not formed in a split-gate flash memory cell.

One approach to alleviate the degradation of tunnel oxide is to separate the tunneling region from the channel with a thick insulating film as taught by Ahn in U.S. Pat. Nos. 5,716,865 and 5,652,161. Another approach, as taught by Wang in U.S. Pat. No. 5,597,751 is to deposit a thick spacer oxide layer on top of the floating gate and the source/drain region to a sufficient thickness to provide electrical insulation thereinbetween.

In still a different approach, Cho, et al., in U.S. Pat. No. 5,766,988 show a method of fabricating a thin film transistor with a negatively sloped gate. According to Cho, et al., a thin film transistor may include an insulation substrate, a gate electrode formed to have a negative slope at one side thereof on the insulation substrate, an insulation film side-wall formed at the other side of the gate electrode, a gate insulation film formed on the insulation substrate, gate electrode and side-wall, a semiconductor layer formed on the gate insulation film, impurity diffusion regions selectively formed within the semiconductor layer over the gate electrode, the side-wall and the insulation substrate on the other side of the gate electrode, and a channel region formed within the semiconductor layer at the side of the gate electrode having the negative slope.

It is disclosed in the present invention a process for preventing reverse tunneling in a split-gate flash memory cell by forming reliable silicon nitride spacers between the control gate and the floating gate without some of the complexities of prior art.

SUMMARY OF THE INVENTION

It is therefore an object of this invention to provide method of forming a split-gate flash memory not susceptible to inadvertent reverse tunneling during programming.

It is another object of this invention to provide a method of forming a spacer on the negatively tapered sidewall of a floating gate in a split-gate flash memory.

It is still another object of the present invention to provide split-gate flash memory cell having a negatively sloped floating gate with a tirangularly shaped silicon nitride spacer and not susceptible to inadvertent reverse tunneling.

These objects are accomplished by providing a silicon substrate having a plurality of active and field regions defined; forming a pad oxide layer over said substrate; forming a nitride layer over said pad oxide layer; forming and patterning a first photoresist layer over said pad oxide layer to form a photoresist mask with a pattern corresponding to the floating gate of said split-gate flash memory cell; etching said nitride layer through said photoresist mask to form an opening with a tapered profile, or a tapered opening, reaching said pad oxide layer underlying said nitride layer; removing said first photoresist layer; removing said pad oxide layer exposed at the bottom of said tapered opening in said nitride layer; forming high temperature oxide (HTO) layer over said substrate including the inside walls of said tapered opening and forming a gate oxide layer at the bottom of said tapered opening; forming a first polysilicon layer over said substrate including said tapered opening; performing chemical-mechanical polishing (CMP) of said first polysilicon layer and removing said HTO layer; oxidizing said fist polysilicon layer formed in said tapered opening, thus forming poly oxide over said first polysilicon layer; performing a high selectivity nitride etch-back to form nitride spacers; forming a second polysilicon layer over said substrate; and patterning said second polysilicon layer with a second photoresist mask having control gate pattern to form a control gate to complete the forming of said split-gate flash memory cell.

These objects are further accomplished by providing a split-gate flash memory cell having a tapered floating gate with a silicon nitride spacer and not susceptible to inadvertent reverse tunneling.

BRIEF DESCRIPTION OF THE DRAWINGS

FIG. 1 is a cross-sectional view of a portion of a semiconductor substrate showing a split-gate flash memory cell of prior art.

FIGS. 2a–2g are cross-sectional views of a portion of a semiconductor substrate showing the steps of forming a split-gate flash memory cell having a nitride spacer according to present practice in the manufacturing line.

FIG. 3a is a cross-sectional view of a portion of a semiconductor substrate showing the patterning of a first photoresist layer formed over a layer of nitride overlying a layer of pad oxide on a substrate of this invention.

FIG. 3b is a cross-sectional view of a portion of a semiconductor substrate showing the forming of a negatively sloped tapered opening in the nitride layer of FIG. 3a, according to this invention.

FIG. 3c is a cross-sectional view of a portion of a semiconductor substrate showing the forming of a high-temperature oxide (HTO) over the substrate of FIG. 3b, according to this invention.

FIG. 3d is a cross-sectional view of a portion of a semiconductor substrate showing the forming of a first layer of polysilicon over the substrate of FIG. 3c, according to this invention.

FIG. 3e is a cross-sectional view of a portion of a semiconductor substrate showing the chemical-mechanical polishing of the substrate of FIG. 3d, according to this invention.

FIG. 3f is a cross-sectional view of a portion of a semiconductor substrate showing the forming of the polyoxide of this invention.

FIG. 3g is a cross-sectional view of a portion of a semiconductor substrate showing the forming of the nitride spacers of this invention.

FIG. 3h is a cross-sectional view of a portion of a semiconductor substrate showing the completion of a split-gate flash memory cell with the negatively sloped floating gate and the nitride spacers of this invention.

DESCRIPTION OF THE PREFERRED EMBODIMENTS

Figures 2E, 2F:
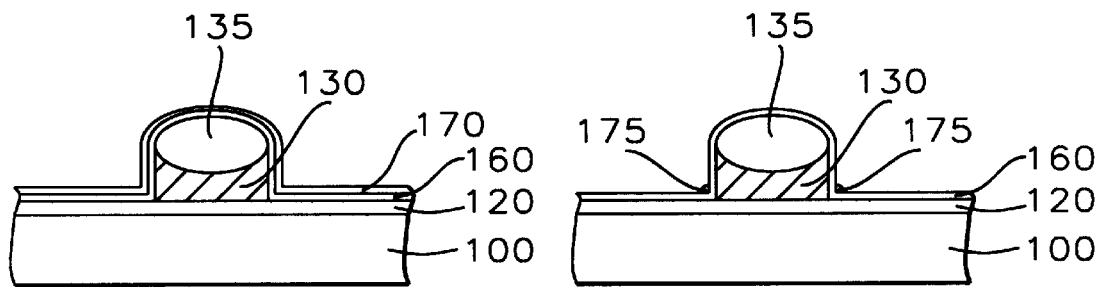

Referring now to the drawings, in particular to FIGS. 3a–3h there is shown steps of forming a split-gate flash memory cell with silicon nitride spacer that prevent inadvertent reverse tunneling between the floating gate and the control gate of the cell. It is preferred that the sidewall of the floating gate have a negative slope in order to affect successfully the forming of the nitride spacer. First, current manufacturing practice of forming floating gates with straight walls are described in FIGS. 2a–2g.

In FIG. 2a, pad oxide layer (120) is first thermally grown over substrate (100) using conventional methods. Next, a first polysilicon layer (130) is formed followed by the deposition of nitride layer (140). A photoresist layer (150) is then formed over the substrate and then patterned with a floating gate pattern (155) as shown in the same FIG. 2a, which in turn, is etched into the nitride layer (140) to replicate opening (145) as shown in FIG. 2b. The photoresist layer, which is no longer needed, is removed. Next, first polysilicon layer (130) that is exposed in the pattern openings (145) in the nitride layer is oxidized to form polyoxide (135) as shown in FIG. 2d. Subsequently, the nitride layer is removed where now polyoxide (135) serves as a hard mask to remove all the first polysilicon portions except those that are covered by the overlying polyoxide layer as shown in FIG. 2d.

Figure 2G:
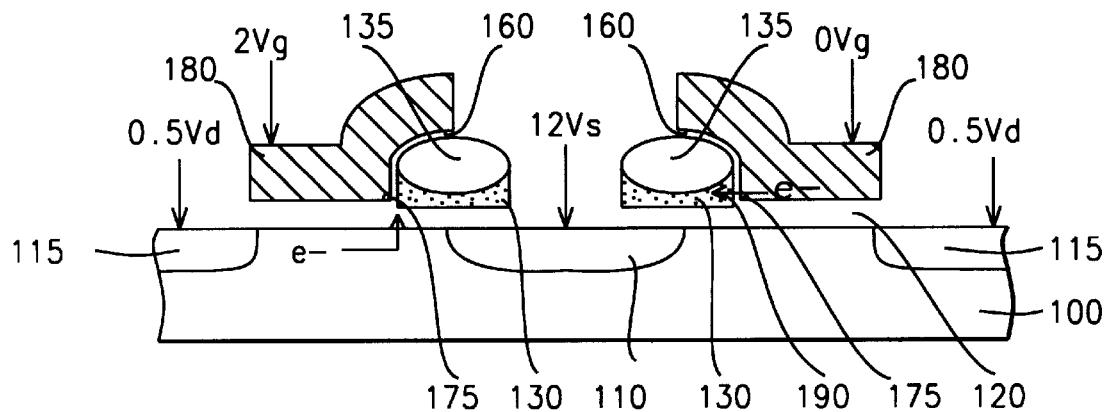

Normally, the next step involves the forming of an intergate or interpoly oxide between the formed floating gate (130) shown in FIG. 2d, and the control gate (170) to be formed subsequently as shown in FIG. 2g. It is preferred that the interpoly oxide comprise high temperature oxide (HTO). Further, it is a key aspect of the present invention that a silicon nitride spacer be formed between the floating gate and the control gate in order to prevent inadvertent reverse tunneling. This is accomplished by forming silicon nitride layer (170) as shown in FIG. 2e and anisotropically etching to form spacer (175) as shown in FIG. 2f. However, with conventional vertical sidewalls of the floating gate, it has been the experience of the present manufacturing line that it is very difficult to form sustainable nitride so spacers. They are usually small and fragile as shown in FIG. 2f. Control gate (170) is formed by depositing a second polysilicon layer covering the interpoly oxide layer (160) including the nitride spacer (175) and then patterning with another layer of photoresist mask (not shown) and etching through the patterns in the photoresist mask.

FIG. 2g depicts the completed split-gate flash memory cell with the small nitride spacer (175) formed on the vertical wall of floating gate. Because of the fragility of the spacer formed on the vertical wall of the floating gate, the spacer as well as the adjacent interpoly oxide become degraded. As a result, during programming, reverse tunneling, or, write disturb, as is commonly known, occurs in the following way: each time flash cells are to be programmed to an "0" state, the word line (formed over the respective control gate) for those cells are selected as shown in FIG. 2g. Here, the selected cell on the left side in FIG. 2g is shown with a gate voltage $V_g$ of 2.0 volts, drain (115) voltage Vd of 0.5 volts while the common source (110) has a Vs voltage of 12 volts. However, cells that are not to be programmed to "0" state must be unselected so that channel hot electrons are not injected into the floating gate. This is shown on the right side of FIG. 2g where the $V_g$ is 0 volts. With poor or degraded spacer such as (175) shown in FIG. 2g, however, it is found that the unselected cell with $0V_g$ experiences reverse tunneling as shown by arrow (190) in FIG. 2g. In other words, the well-known programming "write disturb" occurs due to the unsatisfactory barrier to reverse tunneling provided by the ineffective silicon nitride spacer (175) of the present manufacturing line.

The main feature and key aspect of the present invention is to provide a simplified method for forming a reliable spacer for split-gate flash memory cells. Now, therefore, referring to the preferred embodiment shown in FIGS. 3a–3h, and in particular to FIG. 3a, pad oxide layer (220) is formed over substrate (100), preferably silicon, to serve as an etch stop when etching nitride layer (230) to be formed next. Pad oxide (220) can be formed by conventional thermal oxidation process at a temperature between about 800 to 1000° C. Pad oxide layer (220) has a thickness between about 150 to 500 angstroms (Å).

Figure 3A:
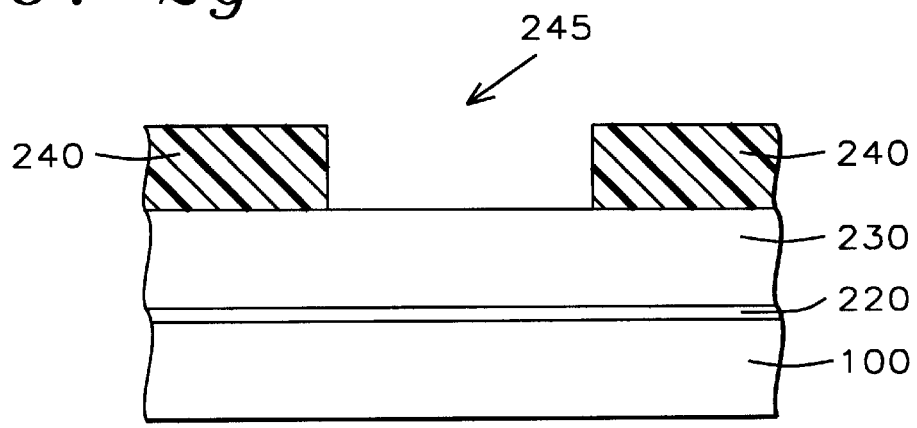
FIGS. 3a–3h show the preferred embodiment of the present invention, and more specifically.
Figure 3B:
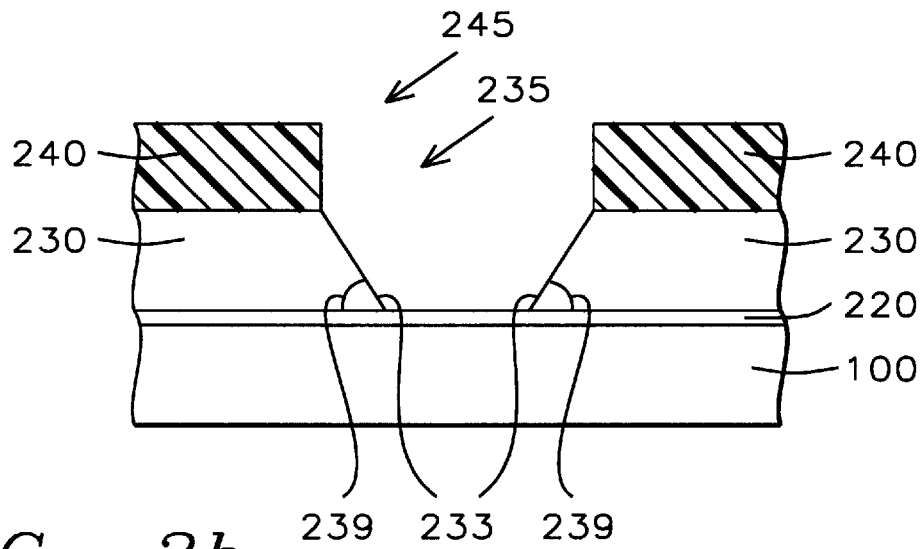

Nitride layer (230) shown in FIG. 3b is formed by reacting either dichlorosilane ($SiCl_2H_2$), or silane ($SiH_4$), with ammonia ($NH_3$) in an LPCVD at a temperature between about 700 to 800° C. The preferred thickness of the nitride layer is between about 1000 to 2000 Å. This is followed by forming a photoresist mask (240) having patterns (245) over the nitride layer corresponding to areas where floating gates are to be defined as shown in both FIGS. 3a and 3b. The patterns are then etched into the nitride layer (230) forming openings (235) where the underlying pad oxide layer (220) is exposed. Subsequently, the photoresist layer is removed using oxygen plasma ashing.

The etching of nitride layer (230) is important because the resulting opening must have tapered wall (233) with negative slope as shown in FIG. 3b. The degree of the tapered wall can be adjusted through controlling process parameters of either patterning or etching, both of which are known to those skilled in the art. Thus, accordingly, the slope of the tapered wall (233) is preferably to have an angle (239) between about 45 to 85 degrees from the horizontal, as shown in FIG. 3b to be effective in the forming of the nitride spacer of this invention.

Figure 3C:
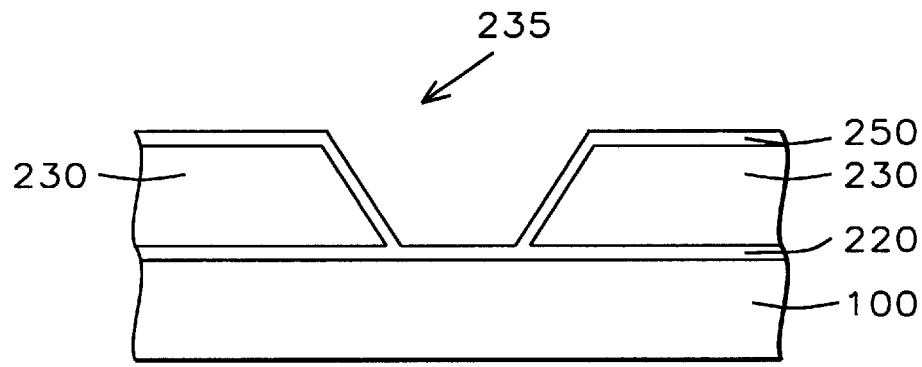
Figure 3D:
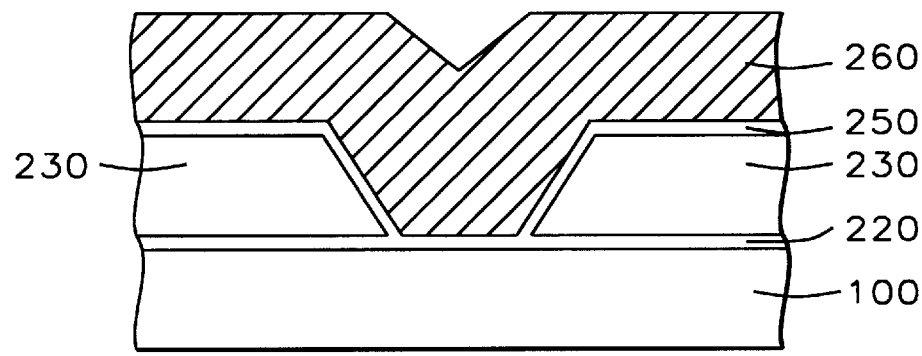
Figure 3E:
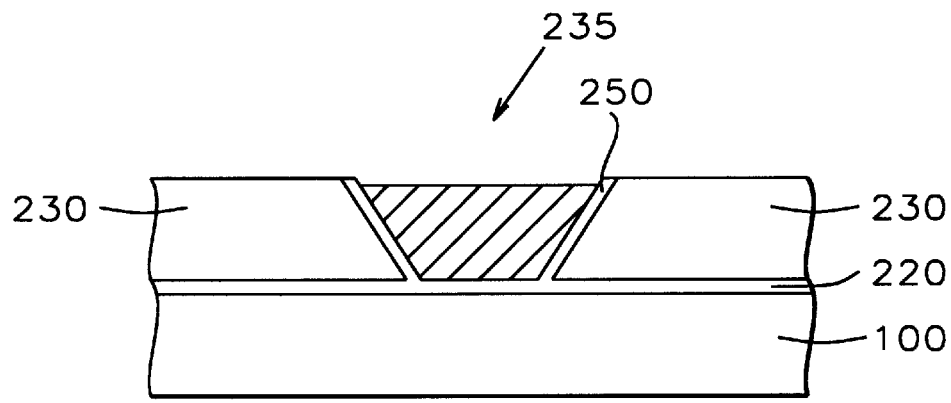

The etching of nitride layer (230) is continued until it stops on pad oxide layer (220) in opening (235), also shown in FIG. 3b. Pad oxide is next removed until the underlying silicon substrate is exposed using conventional wet etch methods. Then, a high-temperature oxide (HTO) layer (250) is formed over the substrate, including the tapered wall of opening (235) as shown in FIG. 3c. This is accomplished by depositing a layer of conformal oxide at a temperature between about 750 to 850° C., and to a thickness between about 50 to 150 Å. This is followed by depositing a first polysilicon layer (260) over the substrate, including oxide layer (250) in opening (235), through reduction of $SiH_4$ using LPCVD at a temperature between about 530 to 630 ° C. The preferred thickness of the first layer of polysilicon is between about 500 to 2000 Å. Next, the substrate is subjected to chemical-mechanical polishing (CMP) using nitride layer (230) as a polishing stop, resulting in the structure shown in FIG. 3e. It will be noted that the substrate is planarized and the surface of the first polysilicon layer (260) in opening (235) is recessed due to the polishing action.

Figure 3F:
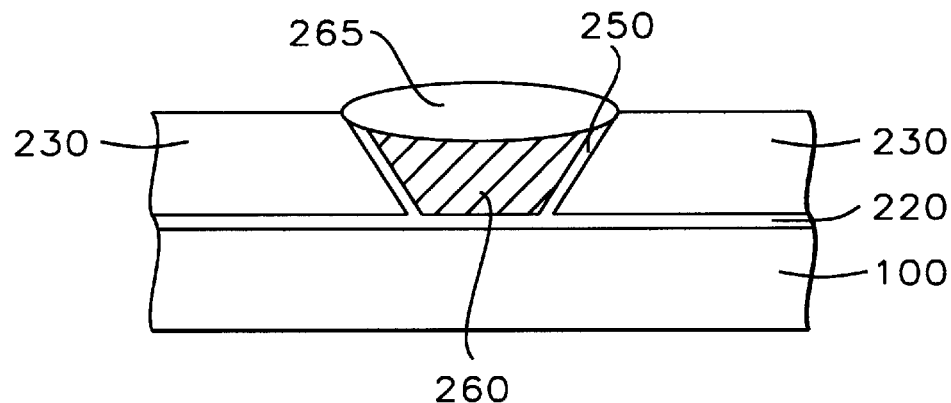
Figure 3G:
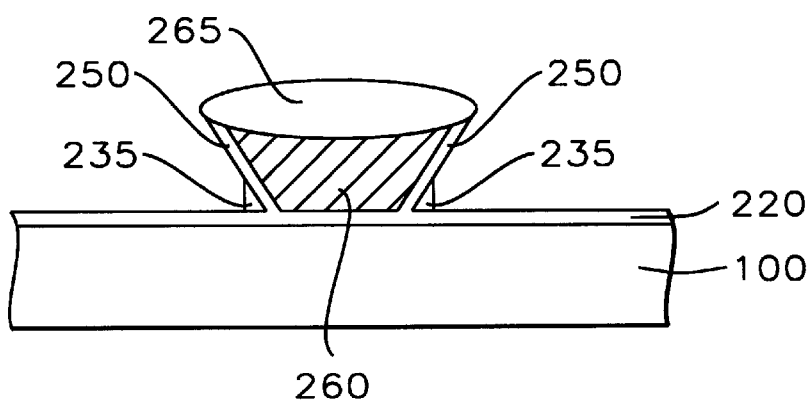

Next, the first polysilicon so formed in opening (235) with tapered wall is next oxidized, preferably, by wet oxidation at a temperature between about 850 to 950° C. to form polyoxide (265), as shown in FIG. 3f. The thickness of polyoxide is between about 1000 to 2000 Å. Subsequently, nitride layer is etched anisotropically such that nitride spacer (235) is formed with good adhesion in the space formed by the negatively sloped wall of the floating gate as shown in FIG. 3g. After having formed the nitride spacer, (235), of this invention, the completion of the split-gate is accomplished by first blanket depositing (not shown) over the substrate a second layer of polysilicon and patterning it to form control gate, (270), shown in FIG. 3h. It is preferred that the second layer of polysilicon is formed using silicon source $SiH_4$ in an LPCVD chamber at a temperature between about 530 to 630° C., and that it has a thickness between about 500 to 2000 Å.

Figure 3H:
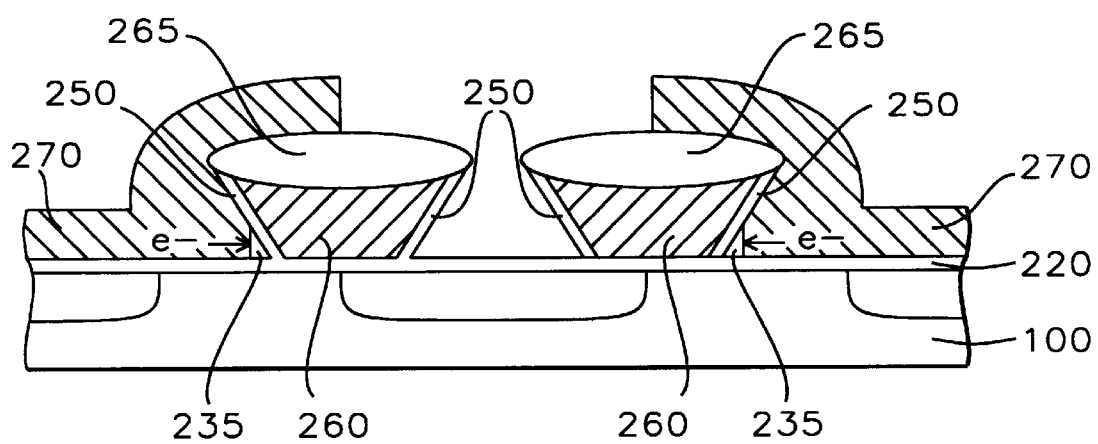

Thus, in the programming of the split-gate flash cell shown in FIG. 3h, the nitride spacer (235) of this invention provides the necessary barrier to prevent reverse tunneling, or "write disturb" of unselected cells. The nitride spacer is formed along the negatively sloped wall of a floating gate. The preferred embodiment also eliminates from the current practice on the manufacturing line the extra step of forming a conformal nitride layer. At the same time, the manufacturability is improved by providing a better etch control in the forming of a more robust nitride spacer.

While the invention has been particularly shown and described with reference to the preferred embodiments thereof, it will be understood by those skilled in the art that various changes in form and details may be made without departing from the spirit and scope of the invention.

What is claimed is:

1. A process for forming nitride spacers to prevent reverse tunneling in a split-gate flash memory cell comprising the steps of:

providing a silicon substrate having a plurality of active and field regions defined;

forming a pad oxide layer over said substrate;

forming a nitride layer over said pad oxide layer;

forming and patterning a first photoresist layer over said pad oxide layer to form a photoresist mask with a pattern corresponding to the floating gate of said split-gate flash memory cell;

etching said nitride layer through said photoresist mask to form an opening with a tapered profile, or a tapered opening, reaching said pad oxide layer underlying said nitride layer;

removing said first photoresist layer;

removing said pad oxide layer exposed at the bottom of said tapered opening in said nitride layer;

forming high temperature oxide (HTO) layer over said substrate including the inside walls of said tapered opening and forming a gate oxide layer at the bottom of said tapered opening;

forming a first polysilicon layer over said substrate including said tapered opening;

performing chemical-mechanical polishing (CMP) of said first polysilicon layer and removing said HTO layer;

oxidizing said fist polysilicon layer formed in said tapered opening, thus forming poly oxide over said first polysilicon layer;

performing a high selectivity nitride etch-back to form nitride spacers therebetween said first polysilicon layer as a floating gate and a second polysilicon layer to be formed as a control gate;

forming said second polysilicon layer over said substrate; and patterning said second polysilicon layer with a second photoresist mask having control gate pattern to form said control gate to complete the forming of said split-gate flash memory cell.

2. The process of claim 1, wherein said pad oxide layer is formed by thermal growth at a temperature between about 800 to 1000° C.

3. The process of claim 1, wherein said pad oxide layer has a thickness between about 150 to 500 Å.

4. The process of claim 1, wherein said forming said nitride layer is accomplished with LPCVD at a temperature between about 700 to 800° C. by reacting dichlorosilane ($SiCl_2H_2$) with ammonia ($NH_3$).

5. The process of claim 1, wherein said nitride layer has a thickness between about 1000 to 2000 Å.

6. The process of claim 1, wherein said first photoresist layer has a thickness between about 0.8 to 1.2 $\mu$m.

7. The process of claim 1 wherein said tapered profile has a slope between about 45 to 85 degrees from the horizontal.

8. The process of claim 1, wherein said removing said pad oxide layer is accomplished by wet etching.

9. The process of claim 1, wherein said forming said high temperature oxide is accomplished at a temperature between about 750 to 850° C.

10. The process of claim 1, wherein said HTO has a thickness between about 50 to 150 Å.

11. The process of claim 1, wherein said forming said first polysilicon layer is accomplished with silicon source $SiH_4$ using LPCVD at a temperature between about 530 to 630° C.

12. The process of claim 1, wherein said first polysilicon layer has a thickness between about 500 to 2000 Å.

13. The process of claim 1, wherein said oxidizing said fist polysilicon layer formed in said tapered opening is accomplished through $H_2/O_2$ wet oxidation methods.

14. The process of claim 1 wherein said performing said high selectivity nitride etch-back to form nitride spacers is accomplished with an anisotropic nitride etch selective to oxide.

15. The process of claim 1, wherein said forming said second polysilicon layer over said interpoly oxide is accomplished with silicon source $SiH_4$ using LPCVD at a temperature between about 530 to 630° C.

16. The process of claim 1, wherein said second polysilicon layer has a thickness between about 500 to 2000 Å.

* * * * *